United States Patent [19]

Russell

[11] Patent Number: 5,127,102
[45] Date of Patent: Jun. 30, 1992

[54] RADIO FREQUENCY MIXER CIRCUITS

[75] Inventor: Mark E. Russell, Londonderry, N.H.

[73] Assignee: Raytheon Company, Lexington, Mass.

[21] Appl. No.: 814,188

[22] Filed: Dec. 20, 1991

Related U.S. Application Data

[63] Continuation of Ser. No. 641,249, Jan. 15, 1991, abandoned.

[51] Int. Cl.⁵ .......................................... H04B 1/26
[52] U.S. Cl. .................................. 455/327; 455/330
[58] Field of Search ............... 455/254, 323, 327-330; 333/117, 118, 202-205, 218

[56] References Cited

U.S. PATENT DOCUMENTS

| | | | |
|---|---|---|---|
| 4,553,266 | 11/1985 | Bates et al. | 455/330 |
| 4,563,773 | 1/1986 | Dixon, Jr. et al. | 455/327 |
| 4,627,104 | 12/1986 | Knochel | 455/327 |
| 4,660,006 | 4/1987 | Tajima et al. | 455/330 |
| 4,661,997 | 4/1987 | Roberts et al. | 455/328 |
| 4,677,693 | 6/1987 | Takayama | 455/330 |
| 4,918,749 | 4/1990 | Entschladen et al. | 455/330 |
| 4,955,079 | 9/1990 | Connerney et al. | |
| 4,998,293 | 3/1991 | Nobory | 455/330 |

OTHER PUBLICATIONS

W-Band Monolithic Subharmonically Pumped Receiver Components, G. L. Lan, J. C. Chen, C. K. Pao, and W. S. Wong, Hughes Aircraft Company Microwave Products Division, Torrance, Calif.
"Radio Frequency Conversion Circuits", Ser. No. 07/599,581 Paul A. Bernkopf, Filed Oct. 18, 1990.

Primary Examiner—Curtis Kuntz
Attorney, Agent, or Firm—Donald F. Mofford; Denis G. Maloney; Richard M. Sharkansky

[57] ABSTRACT

A mixer having a diode pair which includes a first RF propagation network having a first end coupled to a first terminal of the mixer and a second end coupled to a first electrode of the diode pair. The mixer further includes a first means, coupled to the first RF propagation network for providing a low impedance DC signal path to ground and for providing a high impedance signal path to signals propagating at a first radio frequency (RF) frequency. A first transmission line resonator is coupled to the first RF propagation network and has an electrical pathlength which is one quarter of a wavelength at a second RF frequency. The mixer further includes a second RF propagation network having a first end coupled to a second terminal of the mixer and a second end of the RF propagation network coupled to a second electrode of the diode pair. A second transmission line resonator is coupled to the second RF propagation network and has an electrical pathlength which is one quarter of a wavelength at the first RF frequency. The mixer further includes a second means, having a first end coupled to the second RF propagation network and a second end coupled to a third terminal of the mixer, for providing a matched impedance signal path between said second RF propagation network and the third terminal of the mixer to signals propagating at a third RF frequency and for providing a high impedance at said first end of said second means to signals propagating along the second RF propagation network at the second RF frequency.

24 Claims, 6 Drawing Sheets

RADIO FREQUENCY MIXER CIRCUITS

This application is a continuation of U.S. application Ser. No. 07/641,249 filed Jan. 15, 1991 now abandoned.

BACKGROUND OF THE INVENTION

This invention relates generally to radio frequency circuits and more particularly to radio frequency mixer circuits.

As is known in the art, there exists a trend in radio frequency (RF) transmitting and receiving systems towards operation in high frequency bands such as the millimeter wave frequency band. At higher frequencies, insertion losses in RF receiver components such as limiters, mixers and the like are increased and, therefore, as a result, receiver sensitivity is decreased. It is also known that RF receivers operating in the millimeter wave frequency band require mixers capable of operation in this frequency band. A mixer is a device which converts RF power at one frequency into RF power at a different frequency where it can be processed efficiently. Generally, a received radio frequency (RF) signal and a local oscillator (LO) signal are fed to the mixer circuit to provide an intermediate frequency (IF) output signal having a pair of frequency components, often called sidebands, equal to the sum and difference of the frequencies of the RF signal and the LO signal. Mixer circuits that operate in this way are said to be fundamentally pumped mixers. In most receiving systems, the lower sideband (the down converted product) is used, whereas in transmitting systems, the upper sideband (the upconverted product) is selected. The ability to shift a signal in frequency with minimal added noise or distortion is important because the properties of radio frequency signal processing circuits such as amplifiers, filters, and detectors are generally frequency dependent. In order to perform these signal processing functions optimally, it is often necessary to shift signals to the frequencies where the signal processing circuits can perform their functions best.

In the area of microwave/millimeter wave technology, there has been increased emphasis placed on the development of so-called hybrid circuits which utilize a combination of monolithic and printed circuit technology such a microstrip. Hybrid circuits typically have the active portion of the circuit fabricated as a monolithic microwave/millimeter wave integrated circuit (MIMIC) while other components such as filters, which are difficult to fabricate as a monolithic component, are fabricated using printed circuit transmission lines. The monolithic circuit is then disposed on the printed circuit transmission lines resulting in a so-called hybrid circuit. Hybrid microwave/millimeter wave integrated circuits (HMIMIC) offer the promise of low manufacturing costs and low variations in electrical characteristics from unit to unit. Single function circuits, such as mixers, have been developed and fabricated using these HMIMIC techniques.

With mixers and other frequency conversion circuits, such circuits include a device having a nonlinear transfer function that can be expressed as:

$$I = f(V) = a_0 + a_1 V + a_2 V^2 + a_3 V^3 + \ldots + a_n V^n$$

where I and V are the device current and voltage, respectively. For a mixer, voltage applied to the nonlinear device, V(t), is a composite of the radio frequency (RF) signal ($V_{RF} \sin \omega_{RF} t$), where $\omega_{RF}$ is the RF signal frequency in radians, and the local oscillator (LO) signal ($V_{LO} \sin \omega_{LO} t$), where $\omega_{LO}$ is the local oscillator signal frequency in radians, in the form $V(t) = V_{RF} (\sin \omega_{RF} t) + V_{LO} (\sin \omega_{LO} t)$. The LO signal is sometimes called the "pump" waveform, and the mixer is often said to be pumped when the LO signal is applied to the non-linear device. Application of the RF signal and Lo signal to the non-linear device results in a composite output signal, $S_o$, having an infinite series of mixing products given by $$S_o = a_0 + a_1 (V_{RF} \sin \omega_{RF} t + V_{LO} \sin \omega_{LO} t) \\ + a_2 (V_{RF} \sin \omega_{RF} t + V_{LO} \sin \omega_{LO} t)^2 + \ldots \\ + a_n (V_{RF} \sin \omega_{RF} t + V_{LO} \sin \omega_{LO} t)^n.$$

As mentioned above, the mixing product or sideband desired at the output is the sum and difference of the signal inputs ($\omega_{RF} \pm \omega_{LO}$) and is called the intermediate frequency (IF).

One problem with mixers is that a nonlinear device generates many mixing products other than the desired one. These products include harmonics ($n\omega_{RF}$, $m\omega_{LO}$) of the original input signals, $\omega_{RF}$, $\omega_{LO}$ where n and m are positive integers. Additional products further include intermodulation products of the harmonics ($m\omega_{LO} \pm n\omega_{RF}$) and a DC output level. It is generally necessary to filter the input signals and other mixing products from the mixer to extract the desired intermediate frequency signal and reject or terminate the undesired frequency signal components.

As mixer circuit applications extend to higher frequencies, such as the millimeter-wave region mentioned above, additional problems arise. For example, in order to maintain a relatively low IF signal frequency, the frequency of the local oscillator source required for mixing with the received RF signal frequency concomitantly increases. As the LO frequency requirements increase, the ability of LO signal sources to meet suitable power, bandwidth and noise requirements becomes increasingly difficult to achieve. Therefore, the relative cost of the LO source will increase while the relative reliability of the LO source will decrease.

One solution to this problem is to use the so-called subharmonically pumped (SHP) mixer. The SHP mixer operates similarly to the fundamentally pumped mixer, except that the SHP mixer is pumped at a submultiple of the LO frequency normally used with a fundamentally pumped mixer.

In the millimeter-wave frequency region, a common subharmonically pumped waveguide mixer is the so-called balanced subharmonically pumped mixer which includes two pairs of anti-parallel diodes as mixing elements. Each pair of diodes has a cathode of a first one of the diodes connected to an anode of a second one of the diodes and a cathode of the second diodes connected to an anode of the first diodes. In one embodiment of a balanced configuration, the two pairs of anti-parallel diodes are disposed in parallel on a thin substrate such as quartz. The substrate is disposed in the transverse plane of a waveguide, so that the diodes intercept RF energy in the waveguide. An LO signal is supplied to the two pairs of anti-parallel diodes through a power divider. Each pair of diodes produces an IF output signal in response to applied RF energy in the waveguide and the applied LO signal. The IF signals, properly phased, are fed to a pair of input ports of a quadrature coupler with one of the remaining ports providing an output signal and the last port being terminated in a characteristic impedance as is known.

Several problems exist with the balanced subharmonic mixer circuit approach mentioned above. First, since the anti-parallel diode pairs are in parallel, the impedance mismatch between the diode pair and the RF signal and IF signal load impedances is doubled. To achieve a good match to the anti-parallel diode pairs, the waveguide impedance must be kept low. To lower the waveguide impedance, the waveguide height must be made small. At millimeter wave frequencies where the waveguide dimensions are already relatively small, it becomes substantially more difficult to mount the diodes in the waveguide. A second problem with the balanced subharmonic mixer circuit is the requirement to have power divider circuits which further complicate the design, and increase the loss of the mixer circuit.

Another example of a subharmonically pumped mixer is the single ended subharmonically pumped mixer which includes one pair of anti-parallel diodes. As mentioned earlier, application of a composite waveform of the RF signal and LO signal provides an output having frequencies that include $m\omega_{LO} \pm n\omega_{RF}$. When the same composite waveform is applied to a symmetric anti-parallel diode pair, signals having frequencies of $m\omega_{LO} \pm n\omega_{RF}$ in which m−n are even (called even-order harmonics) including $\omega_{RF} - \omega_{LO}$ and $\omega_{RF} + \omega_{LO}$ and the DC term flow only within the diode loop. Signals having frequencies in which m−n are odd (odd-order harmonics) including $\omega_{RF} - 2\omega_{LO}$ flow out of the diode pair. A typical implementation of a single-ended SHP mixer includes one anti-parallel diode pair and three bandpass filters. Bandpass filters are used to filter out undesired signals at each mixer port.

A mixer having an anti-parallel diode pair with a first electrode fed by an RF signal and a second electrode fed by an LO signal would typically have a bandpass filter at the first electrode for filtering undesired signals in the RF signal path and a bandpass filter at the second electrode for filtering undesired signals in the LO signal path. A third bandpass filter would be used for filtering undesired signals in the IF signal path.

The problem of impedance matching between the diode pair and the waveguide in the balanced SHP waveguide mixer mentioned above is somewhat lessened in the single-ended SHP waveguide mixer since only one diode pair is required in the single-ended SHP mixer. Nevertheless, it remains a problem to match the naturally low diode impedance to the naturally high waveguide impedance.

A further problem with using a bandpass filter at each mixer port is that the conversion loss of the mixer increases because the bandpass filters have relatively high insertion loss characteristics particularly at millimeter wave frequencies.

A further problem with this implementation is that bandpass filters are difficult to fabricate at millimeter wave frequencies due to the sensitivity of the bandpass filters to fabrication tolerances.

SUMMARY OF THE INVENTION

In accordance with the present invention, a mixer circuit having three terminals, includes an anti-parallel connected diode pair having a first electrode and a second electrode. The mixer further includes a first RF propagation network having a first end coupled to a first terminal of the mixer and a second end coupled to the first electrode of the anti-parallel diode pair, a first means coupled to the first RF propagation network for providing a low impedance DC signal path to ground and for providing a high impedance path at the point where the first means is coupled to the first RF propagation network to a signal propagating at a RF frequency. A first open circuit transmission line resonator having an electrical pathlength which is one quarter of a wavelength at an LO frequency is coupled to the first RF propagation network at a first electrical pathlength from the first electrode of the anti-parallel diode pair to provide a high impedance path to a signal at the LO frequency propagating along the first RF propagation network. The mixer circuit further includes a second RF propagation network having a first end coupled to the second terminal of the mixer and a second end coupled to the second electrode of the anti-parallel diode pair. A second open circuit transmission line resonator having an electrical pathlength which is one quarter of a wavelength at a RF frequencies is coupled to the second RF propagation network at a second electrical pathlength from the second electrode of the anti-parallel diode pair to provide a high impedance path to a signal at the RF frequency propagating along the second RF propagation network. The RF mixer circuit further includes second means, disposed between the second electrode of the anti-parallel diode pair and the third terminal of the mixer, and at a third electrical pathlength from the second electrode of the anti-parallel diode pair along the second RF propagation network, for providing a high impedance at the connection of the second means and the second RF propagation network to signals propagating at the LO frequency. The second means further provides a matched impedance path between the second RF propagation network and the third mixer terminal for signals at the IF frequency. With such an arrangement, a radio frequency mixer circuit includes a plurality of transmission line resonators to provide specific impedances to RF signals at specific frequencies thereby eliminating the need for bandpass filter circuits. The elimination of bandpass filter circuits through the use of transmission line resonators provides a substantial improvement in conversion loss of the RF mixer circuit since the filter circuits disposed along an RF propagation network provide a greater insertion loss characteristic to signals propagating along the RF propagation network than do transmission line resonators disposed along the same RF propagation network. Further, the transmission line resonators provide advantages to fabrication of the RF mixer circuit as a hybrid microwave/millimeter wave integrated circuit since such transmission line resonators are not as sensitive to fabrication tolerances as the bandpass filter approach described in the prior art. Thus, the use of transmission line resonators provides both electrical performance and manufacturing advantages.

In accordance with a further aspect of the present invention, a mixer includes a substrate having first and second opposing surfaces with the first surface having a ground plane disposed thereon. Disposed on the second surface of the substrate is an anti-parallel connected diode pair having first and second electrodes. Also disposed on the second surface is a filter having first and second electrodes. The mixer further includes a first RF propagation network having a first end coupled to a first terminal of the mixer and a second end coupled to the first terminal of the filter. A first end of a second RF propagation network is coupled to the second filter terminal and a second end of the second RF propagation is coupled to the first electrode of the anti-parallel connected diode pair. A first means coupled to the second RF propagation network provides a low impedance DC signal path to ground and a high impedance at the point said means is coupled to the second RF propagation network to a signal propagating at an RF frequency. A first transmission line resonator, having an electrical pathlength corresponding to one quarter wavelength at an LO frequency, is coupled to the second RF propagation network at a predetermined electrical pathlength from the first electrode of the anti-parallel diode pair to provide a high impedance path to a signal at the LO frequency propagating along the second RF propagation network from the first diode pair terminal. A third RF propagation network is coupled between the second electrode of the anti-parallel diode pair and a second terminal of the mixer. A second transmission line resonator, having an electrical pathlength corresponding to one quarter wavelength at the RF frequency, is coupled to the third RF propagation network at a first preselected distance from the second electrode of the anti-parallel diode pair for providing a high impedance path to a signal propagating along the third RF propagation network at the RF frequency. A second means is disposed between the second electrode of the diode pair and a third terminal of the mixer. The second means are disposed along the third RF propagation network at a second predetermined distance from the second electrode of the diode pair. The second means provides a high impedance characteristic at the connection of the second means to the third RF propagation network to signals at the LO frequency and provides a matched impedance signal path between the third RF propagation network and the third mixer terminal for signals propagating along the third Rf propagation network at the IF frequency. A third transmission line resonator, having an electrical pathlength corresponding to one quarter wavelength at the IF frequency, is disposed along the third RF propagation network, at a preselected distance, to provide a high impedance at the pained where the second means is coupled to the third RF propagation network, thereby causing IF frequency singles to propagate through the second means towards the third mixer terminal. With such an arrangement, a mixer, having a substrate and a plurality of transmission line resonators spaced a predetermined distance along transmission lines, in cooperation with a filter network, is provided for use as a low conversion loss mixer circuit. That is, the transmission line resonators and filter network together provide selected impedances along the RF propagation networks to provide frequency selective signal paths in a mixer. Such a mixer circuit eliminates the problem of matching the diode impedances to waveguide impedances since transmission lines disposed on a substrate provide signal paths to the diodes. Such a mixer circuit also provides low insertion loss characteristics, can be more easily designed to provide desired frequency selective signal paths over ranges of frequencies and may be provided as a monolithic/microwave integrated circuit. Further, the transmission line resonators are more easily fabricated and are generally smaller in size than bandpass filter networks.

BRIEF DESCRIPTION OF THE DRAWINGS

The foregoing features of the invention as well as the invention itself may be more fully understood from the following detailed description of the drawings in which.

BRIEF DESCRIPTION OF THE PREFERRED EMBODIMENTS

Figure 1:
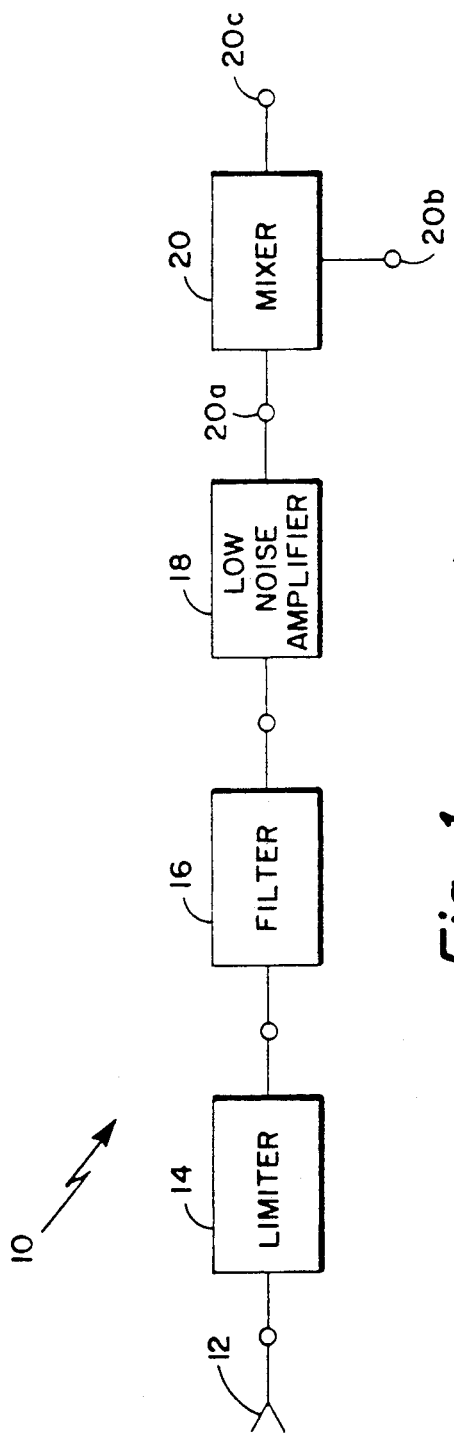
FIG. 1 is a block diagram of a RF receiving system.

Referring now to FIG. 1, an RF receiving system 10 is shown to include an antenna 12 which feeds a received input signal to a limiter 14. The limiter 14 is used to protect the remaining circuits in the receiving system 10 from excessive power levels. The limiter 14 feeds the input signal to a filter 16. Bandpass filter 16 feeds an appropriately filtered signal to a low noise amplifier (LNA) 18. LNA 18 feeds the RF signal as an input to terminal 20a of RF mixer 20. The mixer 20 is fed by a local oscillator (LO) signal at terminal 20b. In response to the input RF signal and the local oscillator signal, the mixer 20 provides an output signal at terminal 20c. The output signal is here the sum or difference between the LO signal and the RF signal.

Figure 2:
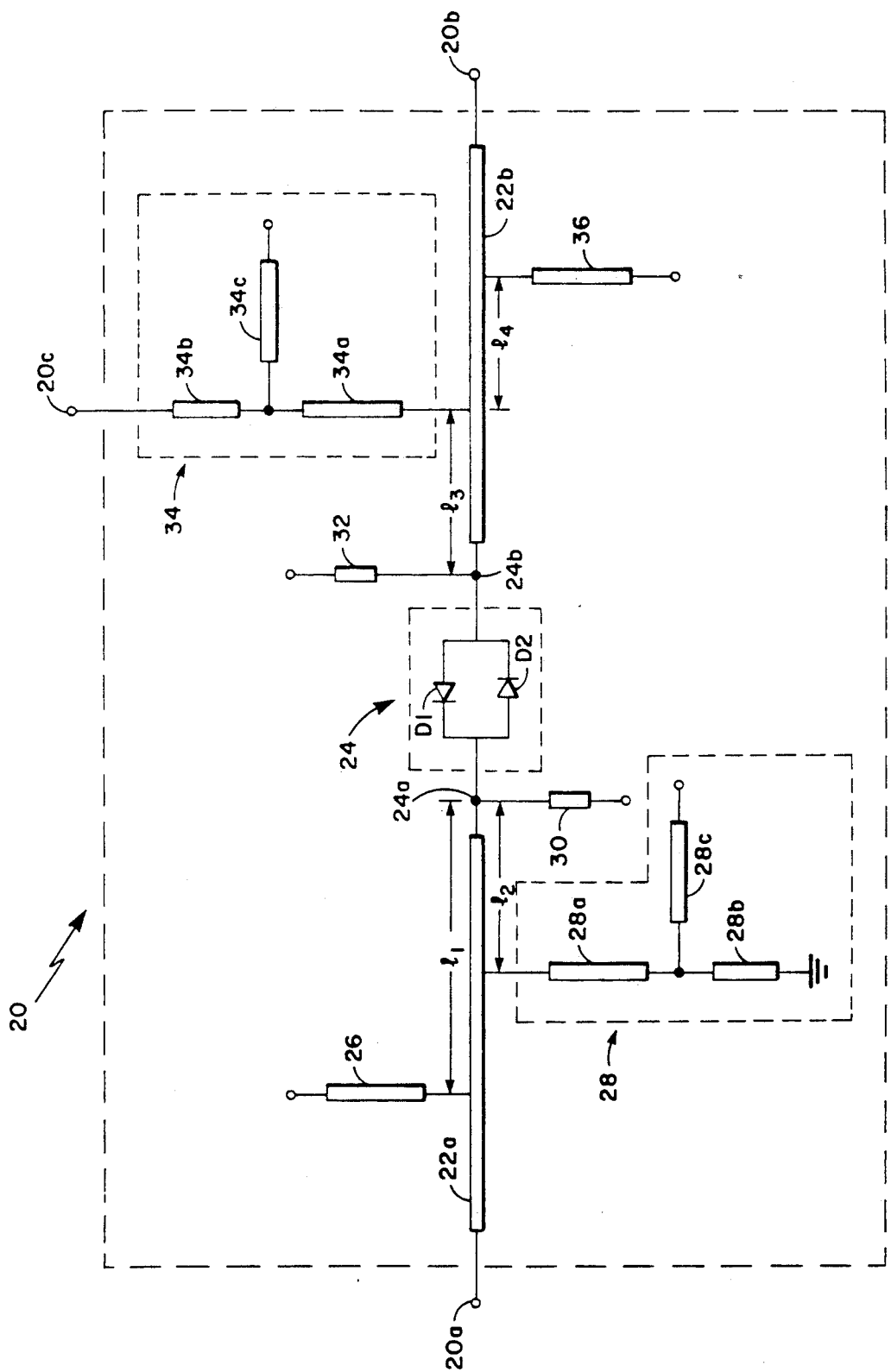
FIG. 2 is a schematic diagram of an RF mixer circuit.

Referring now to FIG. 2, the RF mixer 20 as shown in FIG. 1 is shown having terminals 20a, 20b and 20c. The mixer 20 includes a first RF propagation network 22a, having a first end coupled to terminal 20a and a second end coupled to a first terminal 24a of an anti-parallel connected diode pair 24. The mixer 20 further includes first transmission line resonator 26 having an electrical pathlength corresponding to one quarter wavelength at the intermediate frequency, (IF) disposed along RF propagation network 22a at a distance $l_1$ from diode pair terminal 24a. A high impedance (ideally an RF open circuit) is provided to IF frequency signals at diode pair terminal 24a when $l_1$ is selected to correspond to an electrical pathlength of one quarter wavelength at the IF frequency.

A network 28 for providing a DC path to ground, comprised of transmission line sections 28a, 28b and transmission line resonator 28c, is coupled to the first RF propagation network 22a at a distance $l_2$ from terminal 24a. The distance $l_2$ from terminal 24a is not critical but a distance providing optimum performance may be determined analytically or empirically based on the electrical pathlength between mixer terminal 20a and diode pair terminal 24a. A first end of transmission line 28a is coupled to RF propagation network 22a. A second end of transmission line 28a is coupled to a first end of transmission line 28b whose second is coupled to ground. A first end of transmission line resonator 28c is coupled to the second end of transmission line 28a. Transmission line section 28a and transmission line resonator 28c, each having an electrical pathlength corresponding to one quarter wavelength at the RF frequency, together provide a high impedance at the connection of network 28 with RF propagation network 22a to RF frequency signals propagating along RF propagation network 22a.

A third transmission line resonator 30, having an electrical pathlength corresponding to one quarter wavelength at the LO frequency, is disposed along RF propagation network 22a at terminal 24a of the anti-parallel connected diode pair 24. Transmission line resonator 30 provides a low impedance (ideally an RF short circuit impedance) to LO signals at terminal 24a and thereby reflects LO frequency signals appearing at diode pair terminal 24a back into diode pair 24. Since LO frequency signals are reflected at terminal 24a back into diode pair 24, LO signals are prevented from propagating between diode pair terminal 24a and mixer terminal 20a along propagation network 22a and thus a constant, optimum LO frequency signal level is provided to diode pair 24.

Mixer 20 further includes a second RF propagation network 22b having a first end coupled to terminal 24b of anti-parallel connected diode pair 24 and a second end coupled to mixer terminal 20b. The mixer 20 further includes a fourth transmission line resonator 32, having an electrical pathlength corresponding to one quarter wavelength at the RF frequency, disposed along the second RF propagation network 22b at terminal 24b of anti-parallel diode pair 24.

Transmission line resonator 32 provides a low impedance (ideally an RF short circuit impedance) to RF frequency signals at terminal 24b and thereby reflects RF frequency signals at diode pair terminal 24b back into diode pair 24. Since RF frequency signals are reflected back into diode pair 24 the RF frequency signals are prevented from propagating between diode pair terminal 24b and mixer terminals 20b and 20c along propagation network 22b. That is, energy in the RF frequency signal which would have otherwise "leaked" down RF propagation network 22b and therefore away from diode pair 24, is instead reflected back into diode pair 24 to provide additional RF frequency signal energy to the mixer. Thus, the energy in the reflected RF frequency signals is used in the anti-parallel diode pair to achieve a minimum mixer conversion loss.

A network 34, for providing a signal path between RF propagation network 22b and mixer terminal 20c, comprised of transmission line sections 34a, 34b and a fifth transmission line resonator 34c, is coupled to the second RF propagation network 22b at a distance l₃ from diode pair terminal 24b. The distance l₃ from terminal 24b is not critical but a distance providing optimum mixer performance (i.e. low insertion loss) may be determined analytically or empirically based on the electrical pathlength between mixer terminals 20b, 20c and diode pair terminal 24b. A first end of transmission line 34a is coupled to RF propagation network 22b and a second end of transmission line 34a is coupled to a first end of transmission line 34b. A second end of transmission line 34b is connected to mixer terminal 20c. Transmission line resonator 34c is coupled to the second end of transmission line 34a. Transmission line section 34a and transmission line resonator 34c, each having an electrical pathlength corresponding to one quarter wavelength at the LO frequency, provide a high impedance at the connection of network 34 to RF propagation network 22b to LO frequency signals propagating along RF propagation network 22b. Thus, LO frequency signals are prevented from propagating through network 34 to mixer terminal 20c.

The mixer 20, further includes a sixth transmission line resonator 36, having an electrical pathlength corresponding to one quarter wavelength at the IF frequency, disposed along RF propagation network 22b, a distance l₄ from the point where network 34 is coupled to RF propagation network 22b. When distance l₄ corresponds to an electrical pathlength equal to one quarter wavelength at the IF frequency, transmission line resonator 36 provides a high impedance to IF frequency signals propagating from diode pair terminal 24b to terminal 20b along RF propagation network 22b at the point where network 34 is coupled to RF propagation network 22b. Thus, IF frequency signals propagate from diode pair 24 along propagation network 22b and through network 34 to mixer terminal 20c because of the high impedance to IF frequency signals provided by the appropriately spaced transmission line resonator 36. The embodiment described above includes a DC path to ground from a second end of transmission line 28b and a mixer terminal 20c coupled to a second end of transmission line 34b. Alternatively, mixer terminal 20c may be coupled to a second end of transmission line 28b and the DC path to ground may be provided by connecting a second end of transmission line 34b to ground. The distances l₁ and l₄ would need to be adjusted accordingly. This embodiment generally results in a higher mixer conversion loss.

Figure 3:
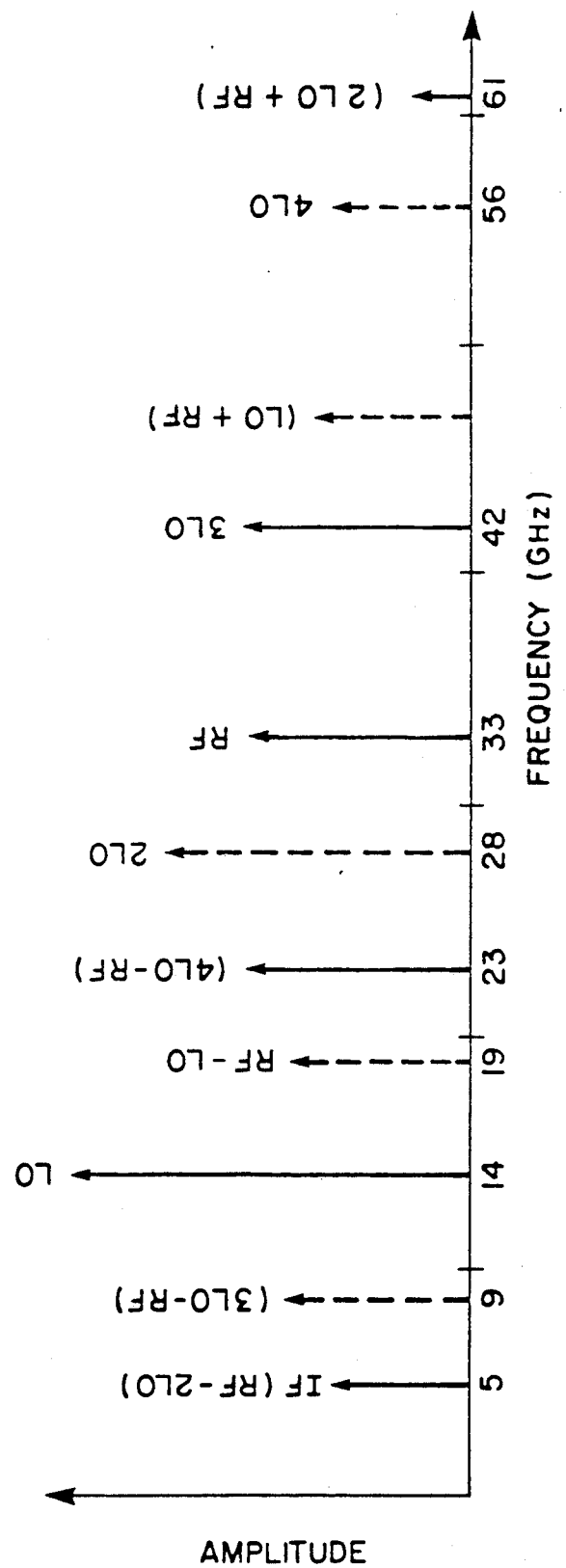
FIG. 3 is a plot of amplitude vs. frequency illustrating in the "small signal" case the relative amplitude and frequency separation between various signals generated in the mixing process used in this invention.

Referring now to FIG. 3, a frequency spectrum of mixing products provided from the diode pair 24 (FIG. 2) in mixer 20 (FIG. 2) is shown when mixer 20 (FIG. 2) is operated as a subharmonically pumped mixer. The frequency spectrum is provided from an input RF signal having a frequency of 33 Ghz fed to diode terminal 24a (FIG. 2) through mixer terminal 20a (FIG. 2) and an LO pump signal having a frequency of 14 GHz applied to the diode pair through mixer terminal 24b (FIG. 2).

The solid lines represent frequencies which are present at diode pair terminals 24a, 24b (FIG. 2). Only the IF frequency signal is allowed to propagate to the mixer terminal 20c (FIG. 2) of the mixer circuit 20 (FIG. 2). The dashed lines represent frequencies which flow within the loop formed by diode pair 24 but are suppressed from appearing at the mixer output terminal 20c of the mixer circuit 20. Harmonics of the fundamental input RF signal are not shown in this frequency spectrum because the amplitude level of the higher harmonics of the RF signal, which are produced by the mixing process are here so low in amplitude as to be considered insignificant. The LO signal and harmonics of the LO signal are eliminated from appearing at output terminal 20c (FIG. 2) by transmission line resonator 34c (FIG. 2).

Figure 4A:
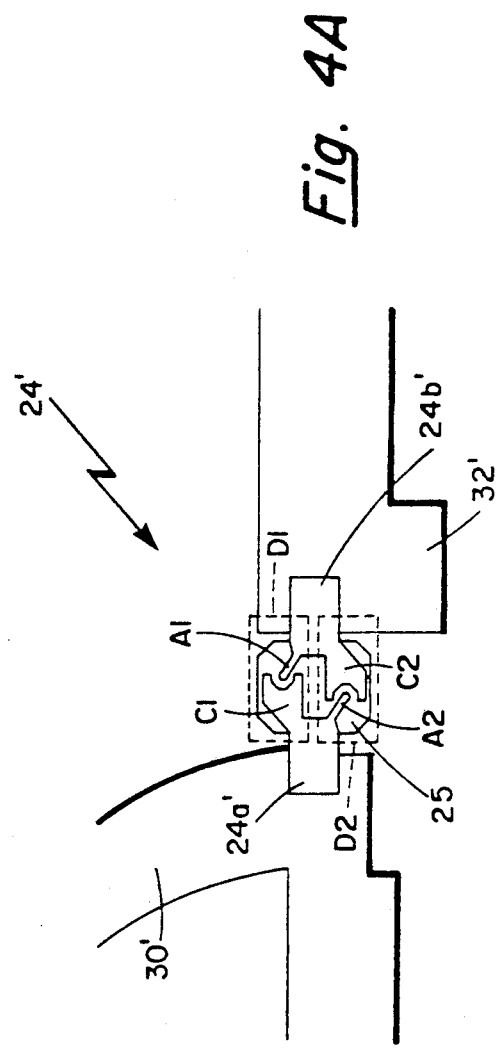
FIG. 4A is an enlarged view of a portion of FIG. 4 showing in detail the anti-parallel diode pair.
Figure 4:
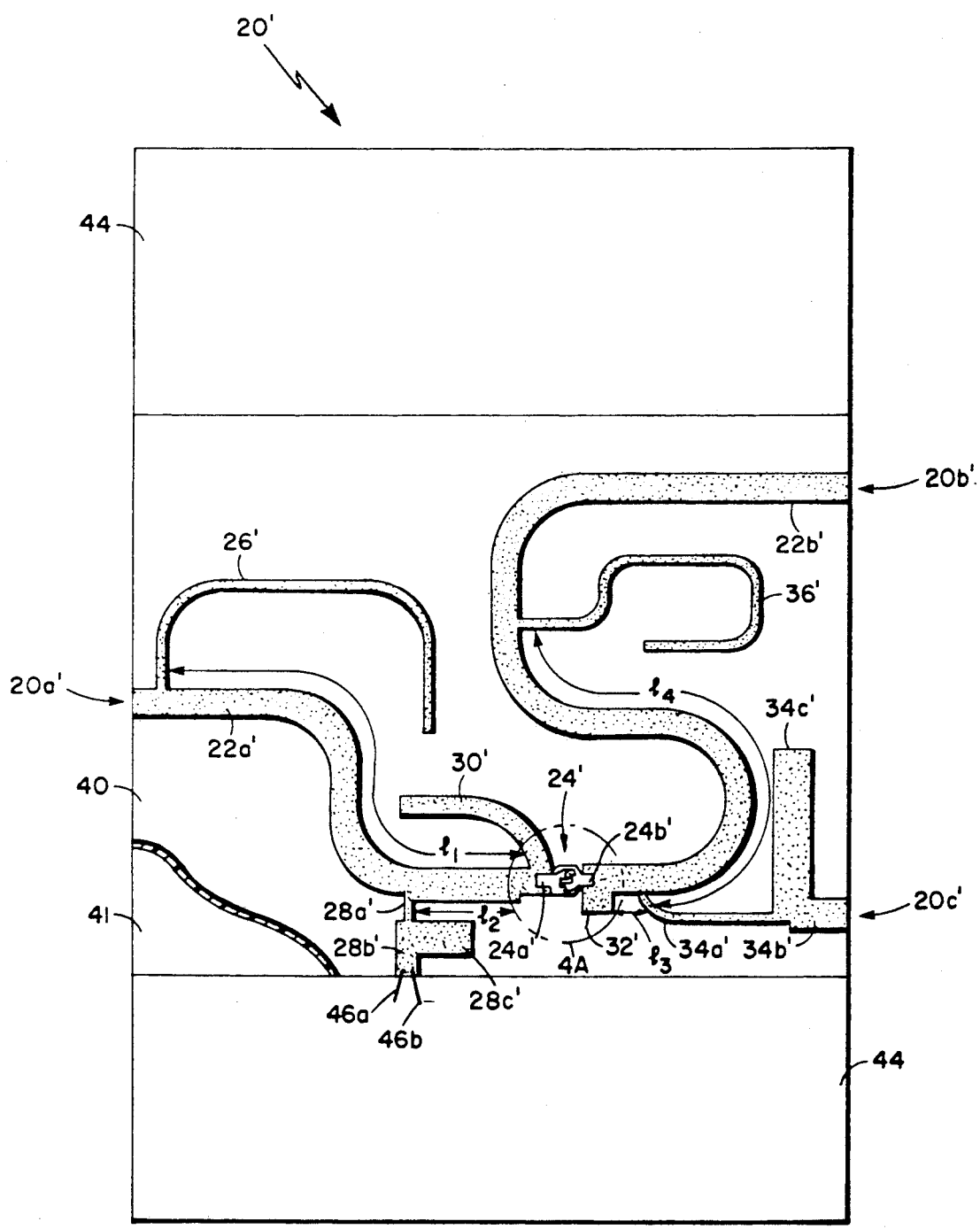
FIG. 4 is a plan view of a first embodiment of an RF mixer circuit.

Referring now to FIGS. 4 and 4A, an embodiment of RF mixer circuit 20 (FIG. 2) is shown fabricated as a hybrid microwave/millimeter wave integrated circuit (HMIMIC) 20' having terminals 20a', 20b' and 20c'. The RF mixer circuit 20' is disposed on a substrate 40, here comprised of 0.010 inch thick alumina or other suitable microwave/ millimeter wave substrate material such as gallium arsenide. The substrate 40 has disposed on a bottom surface thereof, a ground plane conductor 41. The substrate 40 has disposed over a top surface thereof a plurality of strip conductors and an anti-parallel diode pair 24'.

the strip conductors provide transmission line sections 22a, 22b, 28a, 28b, 34a, 34b (FIG. 2) as corresponding microstrip transmission lines 22a', 22b', 28a', 28b', 34a', 34b'. The strip conductors also provide transmission line resonators 26, 28c, 30, 32, 34c, 36 (FIG. 2)

as corresponding microstrip transmission line resonators 26', 28c' 30', 32', 34c' and 36'. The transmission line resonators are disposed at predetermined electrical pathlengths $l_1-l_4$ which are substantially the same as described in conjunction with FIG. 2. Here, transmission line sections and transmission line resonators are smoothly curved since abrupt strip conductor discontinuities provide abrupt impedance changes to high frequency signals. Such impedance discontinuities often cause undesirable radiation of propagating energy particularly at high frequencies. Thus, the use of smoothly curved transmission line sections and transmission line resonators provides compact signal paths having well matched impedances to high frequency signals propagating thereto.

Anti-parallel diode pair 24' (FIG. 4A) includes first and second diodes, D1, D2, (FIG. 4A) here being Schottky barrier diodes provided as a monolithic circuit on a substrate 25, comprised of gallium arsenide (GaAs). Diodes D1, D2 are connected with a cathode C1 of the first diode connected to an anode A2 of the second diode providing a first terminal 24a' and an anode A1 of the first diode connected to a cathode C2 of the second diode providing a second terminal 24b'. Diodes connected in this way are said to be connected as an anti-parallel diode pair. The diode pair terminals 24a', 24b' are connected to the transmission line sections 22a', 22b' using thermal compression bonding techniques as is commonly known. Diode pair 24' is selected to have a predetermined frequency response at the frequencies of interest.

Referring again to FIG. 4, the substrate 40 is mounted to a base, commonly referred to as a carrier 44 to provide contact between the carrier 44 and ground plane conductor 41. The so-called carrier 44 is fabricated from a metal, here brass, capable of both physically supporting the substrate 40 and providing a low electrical resistance path between the substrate ground plane 41 and the carrier 44, such that the carrier 44 and the substrate ground plane 41 are at the same electrical potential, the potential here being ground.

A return path to ground is provided to mixer 20' using bond wires 46a, 46b. Typically such wires are comprised of gold, have a diameter of about 0.001 inch and are connected between the second end of microstrip transmission line 28b' and carrier 44 using ball bonding techniques to provide the DC path to ground between mixer 20' and carrier 44. Here the DC path to ground is provided using bond wires but alternatively could be provided using bond ribbons or via hole technology as is commonly known.

The transmission line sections and transmission line resonators discussed above are fabricated using processing methods as will now be described.

As previously mentioned, the substrate 40 is 0.010 inch alumina having 70 to 100 microns of gold disposed thereon. Since the gold will not adhere directly to the alumina, a conductive layer comprised of titanium-tungsten typically about 20 Å thick, is disposed between said gold layer and said alumina substrate to promote adhesion of the gold to the alumina substrate.

The strip conductors are provided by depositing a photo-resist layer (not shown) over the conductor layer (not shown) on a first surface of the substrate and patterning the photo-resist layer to selectively mask portions of the conductor layer corresponding to the strip conductors comprising the transmission line sections and transmission line resonators shown in FIG. 4. A chemical etchant, such as a combination of sulfuric and hydrochloric acid, is brought into contact with unmasked portions of the conductive layer to remove such unmasked conductor portions while leaving strip conductors which form the transmission line resonators and transmission line sections previously described in conjunction with FIG. 4. The conductive layer on the second surface of the substrate provides the ground plane 41 to the substrate. This process described above is a so-called subtractive process.

Alternatively, the strip conductors could be provided by the so-called "lift off" technique. In the lift off technique, the substrate has a conductive layer disposed only on a second surface thereof to act as the ground plane to the substrate. A patterned photo-resist layer is provided over a first surface of the substrate and a conductive layer is deposited over the photo-resist and exposed portions of the first surface of the substrate provided by the patterned layer. The photo-resist is then "lifted off" carrying away the metal deposited thereon but leaving behind the metal deposited on the substrate and thus providing the patterned strip conductors as shown in FIG. 4.

Figure 5:
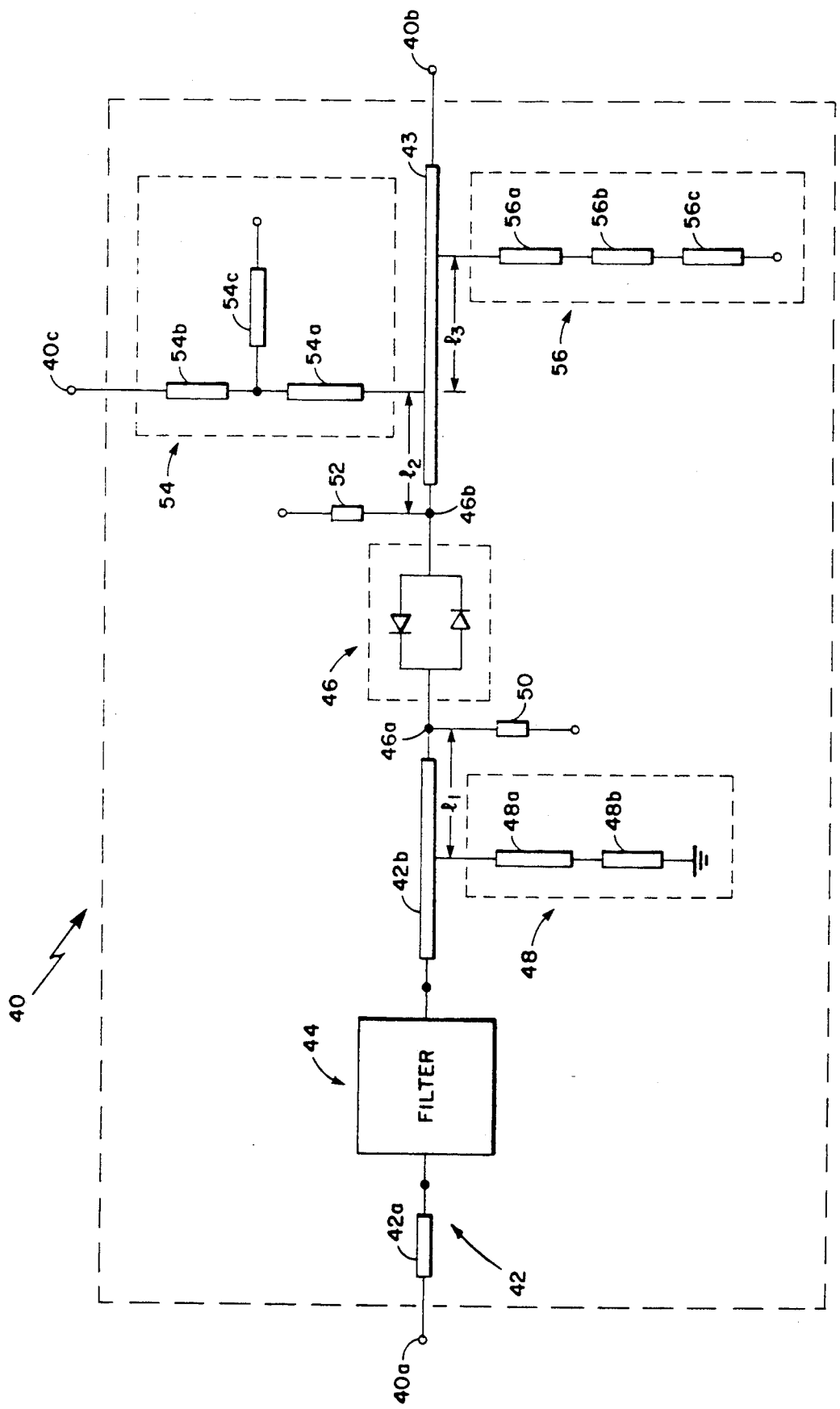
FIG. 5 is a schematic diagram of an RF mixer circuit.

Referring now to FIG. 5, an RF mixer 40 is shown having terminals 40a, 40b and 40c. The mixer 40 includes a first RF propagation network generally denoted 42 and comprised of sections 42a, 42b and having a first end coupled to terminal 40a and a second end coupled to a first terminal 46a of an anti-parallel connected diode pair 46.

Propagation network 42 is shown here to include a filter 44. Filter 44 may be disposed along propagation network 42 in series or in shunt to selectively filter signals propagating along propagation network 42.

A network 48 for providing a DC path to ground, comprised of transmission line sections 48a and 48b, is coupled to RF propagation network 42b at a distance $l_1$ from terminal 46a. The distance $l_1$ from terminal 46a is not critical but a distance providing optimum performance may be determined analytically or empirically based on the electrical pathlength between mixer terminal 40a and diode pair terminal 46a. A first end of transmission line section 48a, is coupled to RF propagation network 42b. It is preferable for transmission line 48a to provide a relatively high characteristic impedance to RF frequency signals propagating along transmission line 42b and thus prevent coupling of RF frequency signals from transmission line 42b to network 48. A second end of transmission line 48a is coupled to a first end of transmission line 48b whose second end is connected to ground.

A first transmission line resonator 50 having an electrical pathlength corresponding to one quarter wavelength at the LO frequency, is disposed along RF propagation network 42b at terminal 46a of the anti-parallel connected diode pair 46. Transmission line resonator 50 provides the same function and advantages as transmission line resonator 30 (FIG. 2) described in conjunction with FIG. 2.

Mixer 40 further includes a third RF propagation network 43 having a first end coupled to terminal 46b of anti-parallel connected diode pair 46 and a second end coupled to mixer terminal 40b. The mixer 40 further includes a second transmission line resonator 52 having an electrical pathlength corresponding to one quarter wavelength long at the RF frequency, disposed along the third RF propagation network 43 at terminal 46b of anti-parallel connected diode pair 46. Transmission line resonator 52 provides the same function and advantages as transmission line resonator 32 (FIG. 2) described in conjunction with FIG. 2.

A network 54 for providing a signal path between RF propagation network 43 and mixer terminal 40c comprised of transmission line sections 54a, 54b and a third transmission line resonator 54c, is coupled to the third RF propagation network 43 at a distance $l_2$ from diode pair terminal 46b. The distance $l_2$ from terminal 46b is not critical but a distance providing a signal path for the IF signal between diode pair terminal 46b and RF mixer terminal 40c with a minimum amount of insertion loss may be determined analytically or empirically based on the electrical pathlength between diode terminal 46b and mixer terminals 40b, 40c. Network 54 is substantially the same as network 34 (FIG. 2) described in conjunction with FIG. 2.

The mixer 40 further includes a fourth transmission line resonator 56, comprised of transmission line sections 56a, 56b and 56c and having an overall electrical pathlength corresponding to one quarter wavelength at the IF frequency. Transmission line resonator 56 is disposed along RF propagation network 43 a distance $l_3$ from the point where network 54 is coupled to RF propagation network 43. When distance $l_3$ corresponds to an electrical pathlength equal to one quarter wavelength at the IF frequency transmission line resonator 56 provides a high impedance to IF frequency signals propagating along RF propagation network 43 from diode pair terminal 46b toward mixer terminal 40b. That is a high impedance is presented to IF frequency signals at the point where network 54 is coupled to RF propagation network 43 thereby causing the IF frequency signal to propagate through network 54 which is coupled to mixer terminal 40c.

Transmission line sections 56a, 56b, and 56c together provide a large impedance mismatch to LO frequency signals propagating along RF propagation network 43. Thus, LO frequency signals propagating along propagation network 43 are prevented from coupling into network 56.

Figure 6:
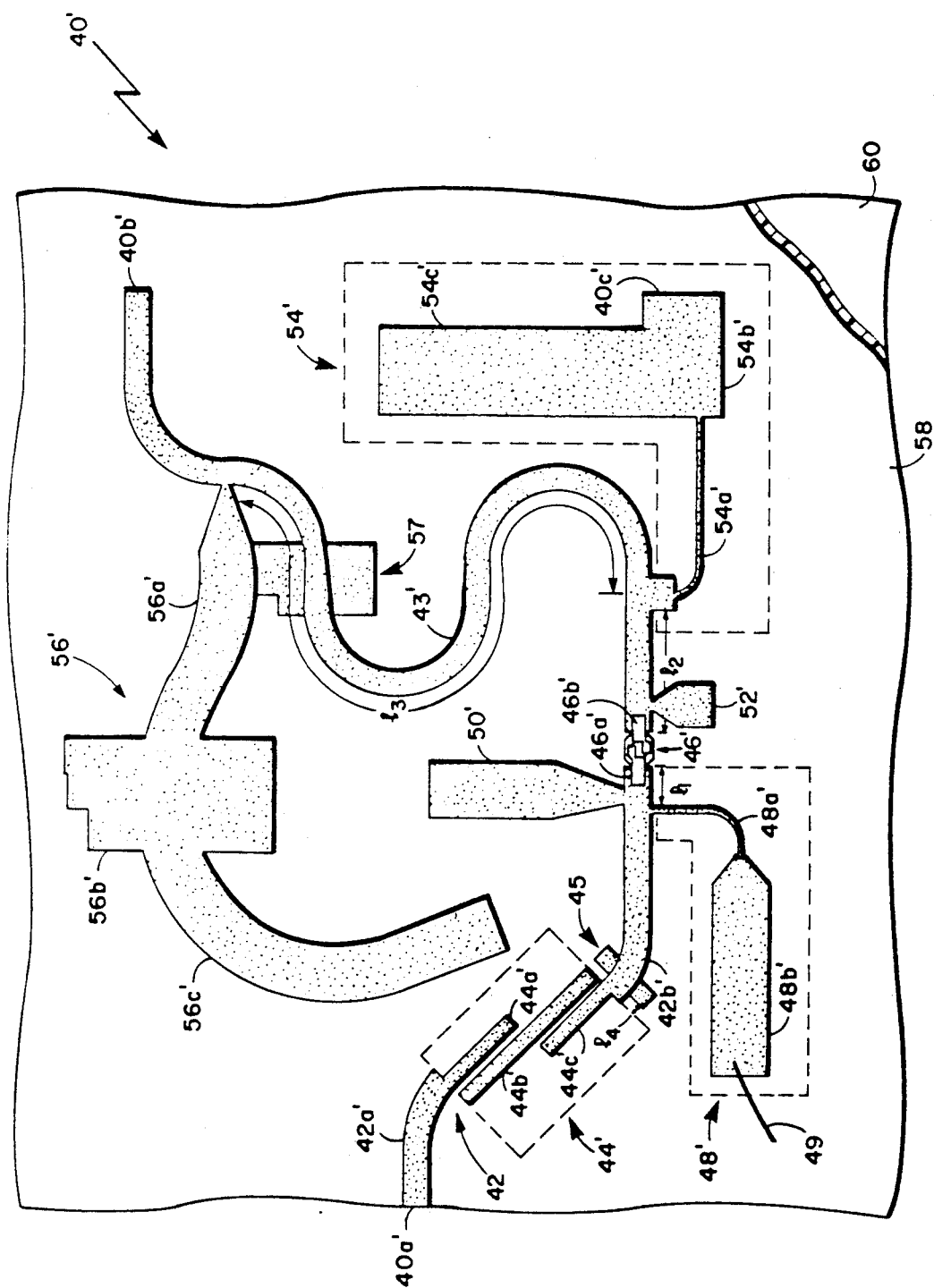
FIG. 6 is a plan view of a second embodiment of an RF mixer circuit.

Referring now to FIG. 6, an embodiment of the RF mixer circuit 40 (FIG. 5), described in conjunction with FIG. 5, is shown fabricated as a hybrid microwave/millimeter wave integrated circuit (HMIMIC) mixer 40' having terminals 40a', 40b' and 40c'. The RF mixer 40' is disposed on a substrate 58, here comprised of 0.010 inch alumina or other suitable microwave substrate material. The substrate 58 has disposed on a bottom surface thereof, a ground plane conductor 60. The substrate 58 has disposed over a top surface thereof a plurality of strip conductors and an anti-parallel diode pair 46'.

The strip conductors provide transmission line sections 42a, 42b, 43, 48a, 48b, 54a, 54b (FIG. 5) as corresponding microstrip transmission lines 42a', 42b', 43', 48a', 48b' 54a' and 54b'. Transmission line sections 42a', 42b', 43' provide 50 ohm characteristic impedances to RF, LO and IF frequency signals propagating thereto. The strip conductors also provide transmission line resonators 50, 52, 54c, 56 (FIG. 5) as corresponding microstrip transmission line resonators 50', 52', 54c' and 56'. In general, the smooth corners and bends of the plurality of strip conductors provide continuous impedance characteristics to RF frequency signals propagating thereto as mentioned in conjunction with FIG. 4.

Band pass filter 44', having 50 ohm input and output characteristic impedances, is comprised of coupled transmission lines here microstrip transmission line resonators 44a', 44b' and 44c'. Transmission line resonators 44a' and 44c' each have an electrical pathlength corresponding to one quarter wavelength at the RF frequency and transmission line resonator 44b' has an electrical pathlength corresponding to one half wavelength at the RF frequency. The width of conductors 44a', 44b' and 44c as well as the gap (not numbered) between said conductors are chosen to provide a minimum insertion loss characteristic and an optimum impedance characteristic over the pass band of the filter 44'. A first end of filter 44' is provided as an integral portion of RF propagation network 42a' and the second end of filter 44' is provided as an integral portion of microstrip transmission line 42b'.

An optional matching network 45 is disposed along microstrip transmission line 42b' at a distance $l_5$ from a first end of transmission line 42b' to improve the impedance match between the filter 44' and the microstrip transmission line 42b'. Distance $l_5$ is selected either empirically or analytically to provide an optimum impedance match between filter 44' and microstrip transmission line 42b'. A second end of transmission line 42b' is connected to terminal 46a' of anti-parallel connected diode pair 46'.

Anti-parallel connected diode pair 46' is comprised of Schottky barrier diodes provided as a monolithic circuit comprised of GaAs and connected as an anti-parallel diode pair as described in conjunction with FIG. 4A. Anti-parallel diode pair 46' is coupled to microstrip transmission lines 42b', 43' using techniques described in conjunction with FIG. 4.

Network 48', coupled to transmission line 42b' a distance $l_1$ from anti-parallel diode pair terminal 46a' for providing a DC path to ground, is comprised of microstrip transmission line sections 48a' and 48b'. The width of microstrip transmission line 48a' is selected to provide a relatively high characteristic impedance to RF frequency signals and thus remain relatively transparent to RF signals propagating along RF propagation network 42b'. A second end of microstrip transmission line 48a' is coupled to a first end of microstrip transmission line 48b'. A DC return path to ground may be provided from a second end of microstrip transmission line 48b' using either bond wires, bond ribbon or via hole technology as described in conjunction with FIG. 4. Here, bond wire 49 is shown connected to transmission line 38b', however the connection to ground is not shown.

Microstrip transmission line resonators 50', 52', 56', each having tapered first ends, are coupled to the appropriate RF propagation network as described in conjunction with the corresponding resonators 50, 52 and 56 of FIG. 5. A tapered first end coupled to an RF propagation network provides less coupling between the transmission line resonator and the RF propagation and also provides a more precise point of contact to the RF propagation network. Thus, the transmission line resonator provides an impedance value which closely corresponds to the pre-selected impedance value. Therefore, a tapered first end improves the electrical performance of the mixer circuit 40'.

A network 54' is coupled between microstrip transmission line 43' and mixer terminal 40c' a distance $l_2$ from diode pair terminal 46b'. Network 54' is comprised of microstrip transmission line sections 54a', 54b' and a microstrip transmission line resonator 54c'. Network 54' provides a high impedance characteristic to LO frequency signals propagating along transmission line 43' and a matched impedance characteristic to IF frequency signals propagating along transmission line 43' as described in conjunction with Network 34 (FIG. 2). The width of microstrip transmission line 54a' is selected to provide transmission line 54a' a high characteristic impedance to LO frequency signals propagating thereto while providing a matched impedance to IF frequency signals propagating thereto.

Thus, a signal path between transmission line 43' and network 54' is provided to IF frequency signals while at the same time coupling of LO frequency signals between transmission line 43' and network 54' is minimized.

A fourth microstrip transmission line resonator 56', having an electrical pathlength corresponding to one quarter wavelength at the IF frequency, is disposed along microstrip transmission line 43' at a distance l₃ from the point where network 54' is coupled to Rf propagation network 43'. When distance l₃ is selected to have an electrical pathlength corresponding to one quarter wavelength at the IF frequency, microstrip transmission line resonator 56', comprised of microstrip transmission line sections 56a', 56b' and 56c', provides a high impedance characteristic to IF frequency signals propagating along microstrip transmission line 43' at the point where network 54' is coupled to RF propagation network 43'. The distance l₃ may be determined analytically or empirically. Thus, the high impedance provided by the appropriately spaced network 56' causes IF frequency signals to propagate through network 54' to mixer terminal 40c'.

An optional matching network 57 may be disposed between transmission lines 43' and 56a'. It is believed that network 57 aids in providing a high impedance at the point where network 56' is coupled to transmission line 43' to LO frequency signals fed into terminal 40b', thereby preventing LO frequency signals from propagating through network 56'.

As is generally known, optional matching networks (not shown) may be disposed along any or all of the plurality of strip conductors as required to compensate for impedance variations which occur in such hybrid microwave/millimeter wave integrated circuits. Such optional matching networks provide impedance matching flexibility required to compensate for undesired signal reflections which occur in such RF mixer circuits. Such reflections are caused by variations in diode impedances, coupling between strip conductors, variations in substrate dielectric constant as well as other causes of impedance variations as are generally known to one of skill in the art.

The plurality of microstrip transmission lines and transmission line resonators may be provided by either a subtractive process or an additive process as described in conjunction with FIG. 4.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A mixer comprising:
 a diode pair comprised of first and second diodes with an anode of the first diode connected to a cathode of the second diode to provide a first electrode and a cathode of the first diode coupled to the anode of the second diode to provide a second electrode;
 a first RF propagation network having a first end coupled to a first terminal of the mixer and a second end coupled to the first electrode of said diode pair;
 first means, coupled to said first RF propagation network, for providing a low impedance DC signal path to ground and for providing a high impedance signal path to signals propagating at a first radio frequency (RF) frequency;
 a first transmission line resonator coupled to said first RF propagation network and having an electrical path length which is one quarter of a wavelength at a second RF frequency;
 a second RF propagation network having a first end coupled to a second terminal of said mixer and a second end of said RF propagation network coupled to the second electrode of said diode pair;
 a second transmission line resonator coupled to said second RF propagation network and having an electrical pathlength which is one quarter of a wavelength at said first RF frequency; and
 second means, having a first end coupled to said second RF propagation network and a second end coupled to a third terminal of the mixer, for providing a matched impedance signal path between said second RF propagation network and said third terminal of the mixer to signals propagating at a third RF frequency and for providing a high impedance at said first end of said second means to signals propagating along said second RF propagation network at said second RF frequency.

2. The mixer of claim 1 wherein said first means comprises:
 a first transmission line section having a first end coupled to said first RF propagation network and a second end, and having an electrical pathlength which is one quarter of a wavelength at said first frequency;
 a second transmission line section having a first end coupled to said second end of said first transmission line section and a second end coupled to ground;
 a third transmission line resonator having a first end coupled to said second end of said first transmission line section and having an electrical pathlength corresponding to one quarter of a wavelength at said first frequency.

3. The mixer of claim 2 wherein said second means comprises:
 a third transmission line section having a first end coupled to said second RF propagation network and a second end and having an electrical pathlength corresponding to one quarter of a wavelength at said second frequency;
 a fourth transmission line section having a first end coupled to said second end of said first transmission line section and a second end coupled to said third terminal of the mixer;
 a fourth transmission line resonator having a first end coupled to said second end of said third transmission line section and having an electrical pathlength corresponding to one quarter of a wavelength at said second frequency.

4. The mixer of claim 3 wherein said first transmission line resonator is coupled to said first electrode of said diode pair and said second transmission line resonator is coupled to said second electrode of said diode pair.

5. A mixer comprising:

a diode pair comprised of first and second diodes with an anode of the first diode connected to a cathode of the second diode to provide a first electrode and a cathode of the first diode coupled to the anode of the second diode to provide a second electrode;

a first RF propagation network having a first end coupled to a first terminal of the mixer and a second end coupled to a first electrode of said diode pair;

first means, coupled to said first RF propagation network at a first electrical pathlength from said first electrode of said diode pair to provide a high impedance to signals propagating along said first RF propagation network at an IF frequency;

second means, coupled to said first RF propagation network, for providing a low impedance DC signal path to ground and for providing a high impedance signal path to signals propagating at an RF frequency;

a first transmission line resonator, coupled to said first RF propagation network and having an electrical pathlength which is one quarter of a wavelength at an LO frequency;

a second RF propagation network having a first end coupled to a second terminal of said mixer and a second end of said RF propagation network coupled to a second electrode of said diode pair;

a second transmission line resonator coupled to said second RF propagation network and having an electrical pathlength which is one quarter of a wavelength at said RF frequency;

third means, having a first end coupled to said second RF propagation network and a second end coupled to a third terminal of the mixer, for providing a matched impedance signal path between said second RF propagation network and said mixer terminal of the mixer to signals propagating at said IF frequency and for providing a high impedance at said first end of said third means to signals propagating along said second RF propagation network at said LO frequency;

fourth means, coupled to said second RF propagation network at a first electrical pathlength from said first end of said third means, for providing a high impedance to a signal propagating at said IF frequency from said first end of said second RF propagation network.

6. The mixer of claim 5 wherein said first means comprises:

a third transmission line resonator having an electrical pathlength which is one quarter of a wavelength at said IF frequency and said first electrical pathlength from said first electrode of said diode pair corresponds to one quarter wavelength at said IF frequency.

7. The mixer of claim 6 wherein said third means comprises:

a first transmission line section having a first end coupled to said second RF propagation network and a second end and having an electrical pathlength which is one quarter of a wavelength at said LO frequency;

a second transmission line section having a first end coupled to said second end of said first transmission line section and a second end coupled to said third terminal of the mixer;

a fourth transmission line resonator having a first end coupled to said second end of said first transmission line section and having an electrical pathlength corresponding to one quarter of a wavelength at said LO frequency.

8. The mixer of claim 7 wherein said fourth means comprises:

a fifth transmission line resonator having an electrical pathlength which is one quarter of a wavelength at said IF frequency and said first electrical pathlength from said first end of said third means corresponds to one quarter of a wavelength at said IF frequency.

9. The mixer of claim 8 wherein said second means comprises:

a third transmission line section having a first end coupled to said second RF propagation network and a second end; and a fourth transmission line section having a first end coupled to said second end of said first transmission line section and a second end coupled to ground; and wherein said third transmission line section has a higher impedance characteristic at said RF frequency than said second RF propagation network and said fourth transmission line section has a lower impedance characteristic at said RF frequency than said second RF propagation network.

10. The mixer of claim 8 wherein said second means comprises:

a third transmission line section having a first end coupled to said second RF propagation network and a second end and having an electrical pathlength which is one quarter of a wavelength at said RF frequency;

a fourth transmission line section having a first end coupled to said second end of said first transmission line section and a second end coupled to ground;

a third transmission line resonator having a first end coupled to said second end of said first transmission line section and having an electrical pathlength corresponding to one quarter of a wavelength at said RF frequency.

11. A mixer comprising:

a diode pair comprised of first and second diodes with an anode of the first diode connected to a cathode of the second diode to provide a first electrode and a cathode of the first diode coupled to the anode of the second diode to provide a second electrode;

a first RF propagation network having a first end coupled to a first terminal of the mixer and a second end coupled to the first electrode of said diode pair;

a first transmission line resonator coupled to said first RF propagation network at a first electrical pathlength corresponding to one quarter of a wavelength at an IF frequency from said first electrode of said diode pair and said first transmission line resonator having an electrical pathlength corresponding to one quarter of a wavelength at said IF frequency;

first means, having a first end coupled to said first RF propagation network and a second end coupled to ground, for providing a low impedance DC signal path to ground and for providing a high impedance at said first end of said first means to signals propagating at an RF frequency;

a second transmission line resonator coupled to said first RF propagation network and having an electrical pathlength corresponding to one quarter of a wavelength at an LO frequency;

a second RF propagation network having a first end coupled to a second terminal of said mixer and a second end of said RF propagation network coupled to the second electrode of said diode pair;

a third transmission line resonator having an electrical pathlength which is one quarter of a wavelength at said RF frequency and coupled to said second RF propagation network;

second means, having a first end coupled to said second RF propagation network and a second end coupled to a third mixer terminal, for providing a matched impedance signal path between said second RF propagation network and said third mixer terminal to signals propagating at said IF frequency and for providing a high impedance at said first end of said second means to signals propagating along said second RF propagation network at said LO frequency;

a fourth transmission line resonator coupled to said second RF propagation network at a first electrical pathlength corresponding to one quarter of a wavelength at said IF frequency from said first end of said second means and having an electrical pathlength which is one quarter of a wavelength at said IF frequency.

12. A mixer comprising:

a substrate having first and second opposing surfaces, said first surface having a ground plane conductor disposed thereon, and having disposed on said second surface:

a diode pair comprised of first and second diodes with an anode of the first diode connected to a cathode of the second diode to provide a first electrode and a cathode of the first diode coupled to the anode of the second diode to provide a second electrode;

a first strip conductor having a first end coupled to a first terminal of the mixer and a second end coupled to the first terminal of said diode pair and including a coupled line filter comprised of a plurality of strip conductors having a width, length and spacing selected to provide a predetermined frequency characteristic and further including a matching network comprised of a strip conductor having a width and length selected to provide a predetermined impedance characteristic and further including a matching network comprised of a strip conductor having a width and length selected to provide a predetermined impedance characteristic;

a second strip conductor coupled to said first strip conductor and having a first relatively high impedance portion compared to that of the first strip conductor and having a second relatively low impedance portion compared to that of the first strip conductor, for providing a low impedance DC signal path to ground and for providing a high impedance path to signals propagating at an RF frequency;

a first transmission line resonator comprised of a strip conductor having a tapered portion coupled to said first strip conductor and having an electrical pathlength which is one quarter of a wavelength at an LO frequency comprised of a strip conductor having a tapered portion to comprise said first end of said first transmission line resonator;

a third strip conductor having a first end coupled to the second electrode of said diode pair and a second end coupled to a second terminal of the mixer and including a matching network comprised of a strip conductor having a width and length selected to provide a predetermined impedance characteristic;

a second transmission line resonator having a first end coupled to said third strip conductor and having an electrical pathlength which is one quarter of a wavelength at said RF frequency and said second transmission line resonator comprised of a strip conductor having a tapered portion to comprise said first end of said second transmission line resonator;

a fourth strip conductor having a first end coupled to said third strip conductor and a second end coupled to a third terminal of the mixer, for providing a matched impedance signal path between said third strip conductor and said third terminal of the mixer to signals propagating at said IF frequency and for providing a high impedance at said first end of said fourth strip conductor to signals propagating along said third strip conductor at said LO frequency;

a third transmission line resonator having a first end coupled to said third strip conductor and having an electrical path length which is one quarter of a wavelength at said IF frequency and said third transmission line resonator comprised of a strip conductor having a tapered portion to comprise said first end of said transmission line resonator and having a second relatively low impedance portion compared to that of the third strip conductor and having a third portion having an impedance characteristic greater than that of the second portion.

13. The mixer of claim 12 wherein said substrate is comprised of 0.010 inch thick alumina.

14. The mixer of claim 13 wherein said filter provides bandpass filter characteristics.

15. The mixer of claim 14 wherein said diode pair are comprised of Schottky barrier diodes provided as a microwave/millimeter wave GaAs monolithic integrated circuit.

16. A mixer comprising:

a diode pair including first and second diodes with an anode of the first diode connected to a cathode of the second diode to provide a first electrode of the diode pair and a cathode of the first diode coupled to the anode of the second diode to provide a second electrode of the diode pair;

a first RF propagation network having a first end coupled to a first terminal of the mixer and a second end coupled to the first electrode of said diode pair;

first means, coupled to said first RF propagation network, for providing a low impedance DC signal path to ground and for providing a high impedance signal path to signals propagating at a first radio frequency (RF) frequency;

a second RF propagation network having a first end coupled to a second terminal of said mixer and a second end of said RF propagation network coupled to the second electrode of said diode pair; and second means, having a first end coupled to said second RF propagation network and a second end coupled to a third terminal of the mixer, for providing a matched impedance signal path between said second RF propagation network and said third terminal of the mixer to signals propagating at a second RF frequency and for providing a high impedance at said first end of said second means to signals propagating along said second RF propagation network at a third RF frequency.

17. The mixer of claim 16 wherein said first means comprises:
- a first transmission line section having a first end coupled to said first RF propagation network and a second end, and having an electrical pathlength which is one quarter of a wavelength at said first frequency;
- a second transmission line section having a first end coupled to said second end of said first transmission line section and a second end coupled to ground; and
- a transmission line resonator having a first end coupled to said second end of said first transmission line section and having an electrical pathlength corresponding to one quarter of a wavelength at said first frequency.

18. The mixer of claim 17 wherein said second means comprises:
- a third transmission line section having a first end coupled to said second RF propagation network and a second end and having an electrical pathlength corresponding to one quarter of a wavelength at said frequency;
- a fourth transmission line section having a first end coupled to said second end of said first transmission line section and a second end coupled to said third terminal of the mixer; and
- a transmission line resonator having a first end coupled to said second end of said third transmission line section and having an electrical pathlength corresponding to one quarter of a wavelength at said third frequency.

19. The mixer of claim 18 further comprising
- a third transmission line resonator having an electrical pathlength corresponding to one quarter wavelength at said third frequency coupled to said first electrode of said diode pair; and
- a fourth transmission line resonator having an electrical pathlength corresponding to one quarter wavelength of said first frequency coupled to said second electrode of said diode pair.

20. A mixer comprising:
- a diode pair including of first and second diodes, with an anode of the first diode connected to a cathode of the second diode to provide a first electrode of the diode pair and the cathode of the first diode coupled to the anode of the second diode to provide a second electrode of the diode pair;
- a first RF propagation network having a first end coupled to a first terminal of the mixer and a second end;
- a filter circuit having a first end coupled to the second end of said first propagation network and a second end coupled to the first electrode of said diode pair said filter circuit having a relatively low insertion loss characteristic to signals at a first RF frequency;
- a second RF propagation network having a first end coupled to a second terminal of the mixer and a second end coupled to the second electrode of said diode pair; and
- first means having a first end coupled to said second RF propagation network and a second end coupled to a third terminal of the mixer for providing a matched impedance signal path between said second RF propagation network and said third terminal of the mixer to signals propagating at a second RF frequency and for providing a high impedance at said first end of said second means to signals propagating along said second RF propagation network at a third RF frequency.

21. The mixer of claim 20 wherein said filter circuit provides bandpass filter characteristics.

22. The mixer of claim 21 wherein said first means comprises:
- a first transmission line section having a first end coupled to said second RF propagation network and having a second end and having an electrical pathlength corresponding to one quarter wavelength at said third RF frequency;
- a second transmission line section having a first end coupled to the second end of said first transmission line section and a second end coupled to said third terminal of the mixer; and
- a first transmission line resonator having a first end coupled to said second end of said first transmission line section and having an electrical pathlength corresponding to one quarter of a wavelength at said third RF frequency.

23. The mixer of claim 22 further comprising:
- a second transmission line resonator having an electrical pathlength corresponding to one quarter of a wavelength at the third RF frequency coupled to said first electrode of said diode pair; and
- a third transmission line resonator having an electrical pathlength corresponding to one quarter of a wavelength at the first RF frequency coupled to said second electrode of said diode pair.

24. The mixer of claim 23 further comprising a fourth transmission line resonator having an electrical pathlength corresponding to one quarter wavelength at the second RF frequency and coupled to said second RF propagation network between the second mixer terminal and the second means at a distance from the second means corresponding to one quarter wavelength at the second RF frequency.

* * * * *